US 8,269,661 B2

(12) United States Patent
Corsi et al.

(10) Patent No.: US 8,269,661 B2
(45) Date of Patent: Sep. 18, 2012

(54) PIPELINED ADC HAVING A THREE-LEVEL DAC ELEMENTS

(75) Inventors: Marco Corsi, Parker, TX (US); Robert F. Payne, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 30 days.

(21) Appl. No.: 12/904,688

(22) Filed: Oct. 14, 2010

(65) Prior Publication Data

US 2012/0092199 A1  Apr. 19, 2012

(51) Int. Cl.
  *H03M 1/34* (2006.01)
(52) U.S. Cl. ........................ 341/162; 341/161
(58) Field of Classification Search .............. 341/161, 341/162
  See application file for complete search history.

(56) References Cited

U.S. PATENT DOCUMENTS

| 6,081,218 | A | 6/2000 | Ju et al. | |
| 6,195,032 | B1* | 2/2001 | Watson et al. | 341/162 |
| 6,369,744 | B1 | 4/2002 | Chuang | |
| 6,373,418 | B1 | 4/2002 | Abbey | |
| 6,441,765 | B1* | 8/2002 | Aram | 341/155 |
| 6,587,060 | B1 | 7/2003 | Abbey | |
| 6,734,818 | B2* | 5/2004 | Galton | 341/161 |
| 6,803,873 | B1* | 10/2004 | Motomatsu | 341/161 |
| 7,280,064 | B2* | 10/2007 | Lin | 341/155 |
| 7,750,834 | B2* | 7/2010 | Sasaki | 341/161 |
| 2010/0245142 | A1 | 9/2010 | Myles et al. | |

FOREIGN PATENT DOCUMENTS

| EP | 1465347 | 10/2004 |
| EP | 2237424 | 10/2010 |

OTHER PUBLICATIONS

PCT Search Report mailed Apr. 24, 2012.

* cited by examiner

*Primary Examiner* — Khai M Nguyen
(74) *Attorney, Agent, or Firm* — John J. Patti; Wade J. Brady, III; Frederick J. Telecky, Jr.

(57) ABSTRACT

In conventional pipelined analog-to-digital converters (ADCs), it is common to employ digital-to-analog converters (DACs) in the ADC stages that use two-state switches or segments. A problem with this arrangement is that for each DAC state there is a noise contribution from each DAC switch, resulting from its current source. Here, however, a DAC is employed that uses three-state DAC switches, which reduces the noise contributions from the DAC switches' current sources and reduces the amount of area used.

15 Claims, 4 Drawing Sheets

US 8,269,661 B2

PIPELINED ADC HAVING A THREE-LEVEL DAC ELEMENTS

TECHNICAL FIELD

The invention relates generally to pipelined analog-to-digital converters (ADCs) and, more particularly, to pipelined ADCs having a three-level or tri-state digital-to-analog converter (DAC) segments or switches.

BACKGROUND

Turning to FIG. 1, an example of a conventional pipelined ADC 100 can be seen. ADC 100 generally comprises a pipeline (which receives an analog input signal AIN) that provides digital signals to a digital output circuit 106 so that a digital output signal DOUT can be generated. The pipeline is generally comprised of a buffer 108, output ADC 104, and ADC stages 102-1 to 102-N (which are generally arranged in a sequence). Each of the ADC stages 102-1 to 102-N generally comprises a track-and-hold (T/H) circuit 112, a sub-ADC 118, DAC 120, and a residue amplifier 122. In operation, as shown in this example, T/H circuit 112, for each ADC stage 102-1 to 102-N, receives an input signal (i.e., signal AIN or the residue from the previous stage) and samples the signal based on clock signal CLK. Sub-ADC 118 (which also uses the clock signal CLK) converts the sample to a digital signal, which is provided to digital output circuit 106 and DAC 120. Residue amplifier 122 then amplifies the difference between the sampled signal (from T/H circuit 112) and the output from DAC 120, which is the residue signal or residue of the stage. The final ADC stage 102-N of the sequence then provides its residue to output ADC 104, which provides a digital signal to digital output circuit 106.

Turning now to FIG. 2, a more detailed example of DAC 120 can be seen. Typically, sub-ADC 118 is a coarse ADC having $2^n$ levels, which can provide a control word to the DAC 120. This control word can be thermometer coded with $2^n$ levels and can be used to control DAC switches 202-1 to 202-R (where each switch 202-1 to 202-R can generate a "+1" or "−1"). To accomplish this, control signals (which are generally derived from the control word) can be provided to transistors QU1 to QUR and QD1 to QDR so as to enable current to be sourced through the "+1" or "−1" paths (through the respective current source 204-1 to 204-R). A problem, however, is that, regardless of the code for DAC 120, the noise from the current sources 204-1 to 204-R can be observed at the output of residue amplifier 122.

Therefore, there is a need for a DAC with improved performance.

Some other conventional circuits are: U.S. Pat. No. 6,369,744; U.S. Pat. No. 6,373,418; U.S. Pat. No. 6,587,060.

SUMMARY

A preferred embodiment of the present invention, accordingly, provides an apparatus. The apparatus comprises a logic circuit that includes: a decoder that receives a control word and that generates a plurality of control signals from the control word; and a plurality of predrivers that are each coupled to the decoder so as to receive at least one of the control signals; and a plurality of three-state digital-to-analog converter (DAC) switches, wherein each three-state DAC is coupled to at least one of the predrivers.

In accordance with a preferred embodiment of the present invention, each of the plurality of three-state DAC switches further comprises: a current source; a first transistor that is coupled to the current source and an associated predriver, wherein the associated predriver controls the first transistor; a second transistor that is coupled to the current source and the associated predriver, wherein the associated predriver controls the second transistor; and a third transistor that is coupled between the current source and ground and that is coupled to the associated predriver, wherein the associated predriver controls the third transistor.

In accordance with a preferred embodiment of the present invention, the first second and third transistors are NPN transistors, and wherein each of the first, second, and third transistors is coupled to the current source at emitter and to the associated predriver at its base.

In accordance with a preferred embodiment of the present invention, each predriver further compromises: a first current source; a second current source; a first cascaded set of differential pairs of transistors that is coupled to first current source and to the decoder; and a second cascaded set of differential pairs of transistors that is coupled to first current source and to the decoder.

In accordance with a preferred embodiment of the present invention, the first cascaded set further comprises: a first bipolar transistor that is coupled to the decoder at its base and to an associated three-state DAC switch at its collector; a second bipolar transistor that is coupled to the decoder at its base and to the associated three-state DAC switch at its collector; a third bipolar transistor that is coupled to the decoder at its base, to the emitters of the first and second bipolar transistors at its collector, and to the first current source at its emitter; and a fourth bipolar transistor that is coupled to the decoder at its base, to the associated three-state DAC switch at its collector, and to the first current source at its emitter.

In accordance with a preferred embodiment of the present invention, the second cascaded set further comprises: a fifth bipolar transistor that is coupled to the decoder at its base and to the associated three-state DAC switch at its collector; a sixth bipolar transistor that is coupled to the decoder at its base and to the associated three-state DAC switch at its collector; a seventh bipolar transistor that is coupled to the decoder at its base, to the emitters of the fifth and sixth bipolar transistors at its collector, and to the second current source at its emitter; and an eighth bipolar transistor that is coupled to the decoder at its base, to the associated three-state DAC switch at its collector, and to the second current source at its emitter.

In accordance with a preferred embodiment of the present invention, an apparatus is provided. The apparatus comprises a digital output circuit; a pipeline having a plurality of analog-to-digital converter (ADC) stages that are coupled in together in a sequence, wherein each ADC stage includes: a track-and-hold (T/H) circuit; a sub-ADC that is coupled to the T/H circuit and to the digital output circuit; a DAC that is coupled to the sub-ADC, wherein the DAC includes: a decoder that is coupled to the sub-ADC; a plurality of predrivers that are each coupled to the decoder; and a plurality of three-state DAC switches, wherein each three-state DAC is coupled to at least one of the predrivers; and a residue amplifier that is coupled to the DAC and the T/H circuit.

In accordance with a preferred embodiment of the present invention, the pipeline further comprises: a buffer that receives an analog input signal and that is coupled to the first ADC stage of the sequence; and a plurality of output ADCs that are each coupled to the last ADC stage of the sequence and to the digital output circuit.

In accordance with a preferred embodiment of the present invention, an apparatus is provided. The apparatus comprises a digital output circuit that generates a digital output signal; a buffer that receives an analog input signal; a plurality of ADC stages that are coupled in together in a sequence, the first ADC stage of the sequence is coupled to the buffer, and wherein each ADC stage includes: a T/H circuit; a sub-ADC that is coupled to the T/H circuit and to the digital output circuit; a DAC that is coupled to the sub-ADC, wherein the DAC includes: a decoder that is coupled to the sub-ADC; a plurality of predrivers, wherein each predriver includes: a first current source; a second current source; a first cascaded set of differential pairs of transistors that is coupled to first current source and to the decoder; a second cascaded set of differential pairs of transistors that is coupled to first current source and to the decoder; and a plurality of three-state DAC switches, wherein each three-state DAC includes: a current source; a first transistor that is coupled to the current source and an associated predriver, wherein the associated predriver controls the first transistor; a second transistor that is coupled to the current source and the associated predriver, wherein the associated predriver controls the second transistor; and a third transistor that is coupled between the current source and ground and that is coupled to the associated predriver, wherein the associated predriver controls the third transistor; and a residue amplifier that is coupled to the first and second transistors from each three-state DAC switch and the T/H circuit; and an output ADC that is coupled to the last ADC stage of the sequence and the digital output circuit.

In accordance with a preferred embodiment of the present invention, the first second and third transistors are bipolar transistors, and wherein each of the first, second, and third transistors is coupled to the current source at emitter and to the associated predriver at its base.

In accordance with a preferred embodiment of the present invention, the first cascaded set further comprises: a first bipolar transistor that is coupled to the decoder at its base and to an associated three-state DAC switch at its collector; a second bipolar transistor that is coupled to the decoder at its base and to the associated three-state DAC switch at its collector; a third bipolar transistor that is coupled to the decoder at its base, to the emitters of the first and second bipolar transistors at its collector, and to the first current source at its emitter; and a fourth bipolar transistor that is coupled to the decoder at its base, to the associated three-state DAC switch at its collector, and to the first current source at its emitter.

In accordance with a preferred embodiment of the present invention, the second cascaded set further comprises: a fifth bipolar transistor that is coupled to the decoder at its base and to the associated three-state DAC switch at its collector; a sixth bipolar transistor that is coupled to the decoder at its base and to the associated three-state DAC switch at its collector; a seventh bipolar transistor that is coupled to the decoder at its base, to the emitters of the fifth and sixth bipolar transistors at its collector, and to the second current source at its emitter; and an eighth bipolar transistor that is coupled to the decoder at its base, to the associated three-state DAC switch at its collector, and to the second current source at its emitter.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent con-structions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
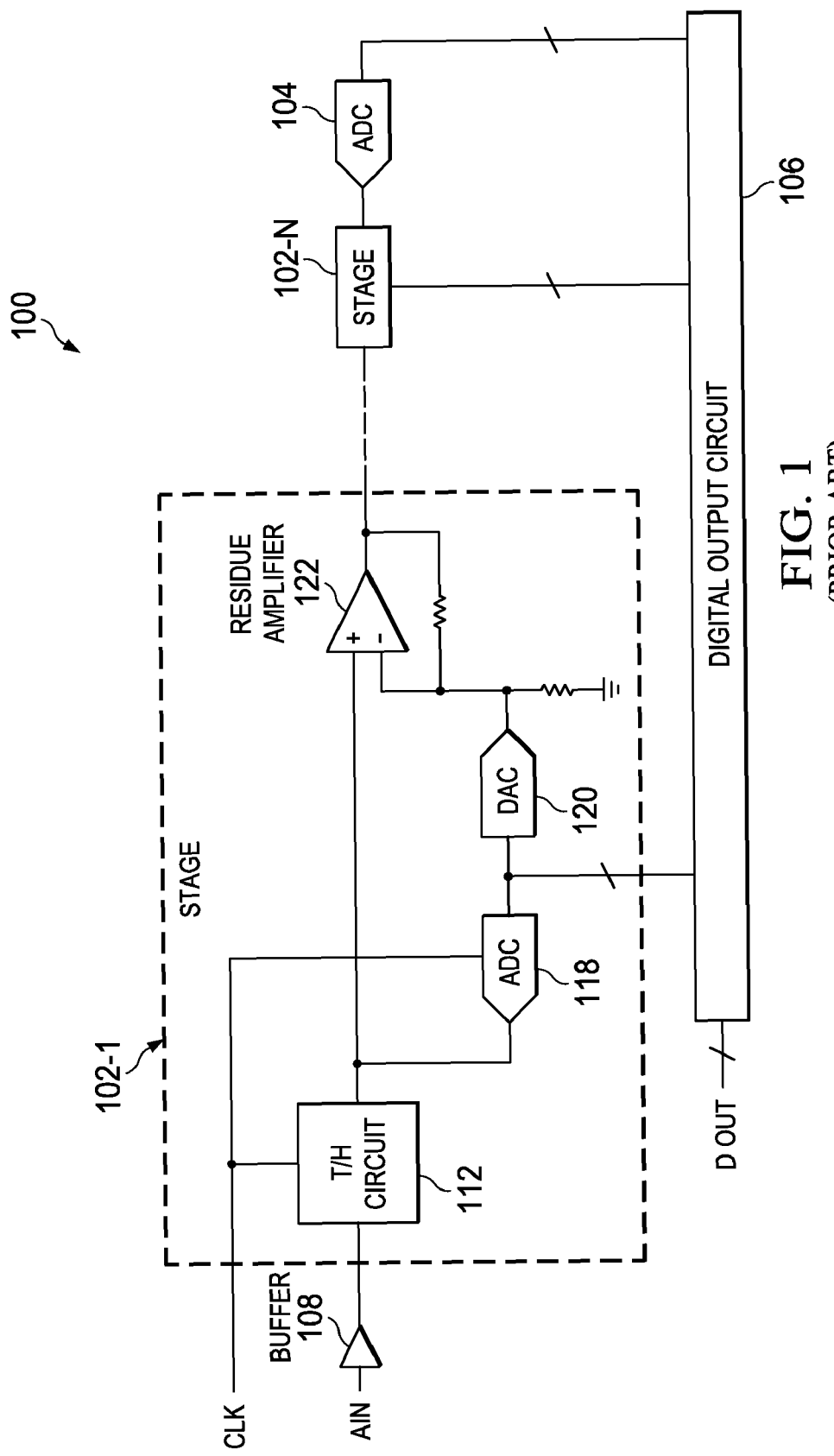
FIG. 1 is a diagram of an example of a conventional pipelined ADC.
Figure 2:
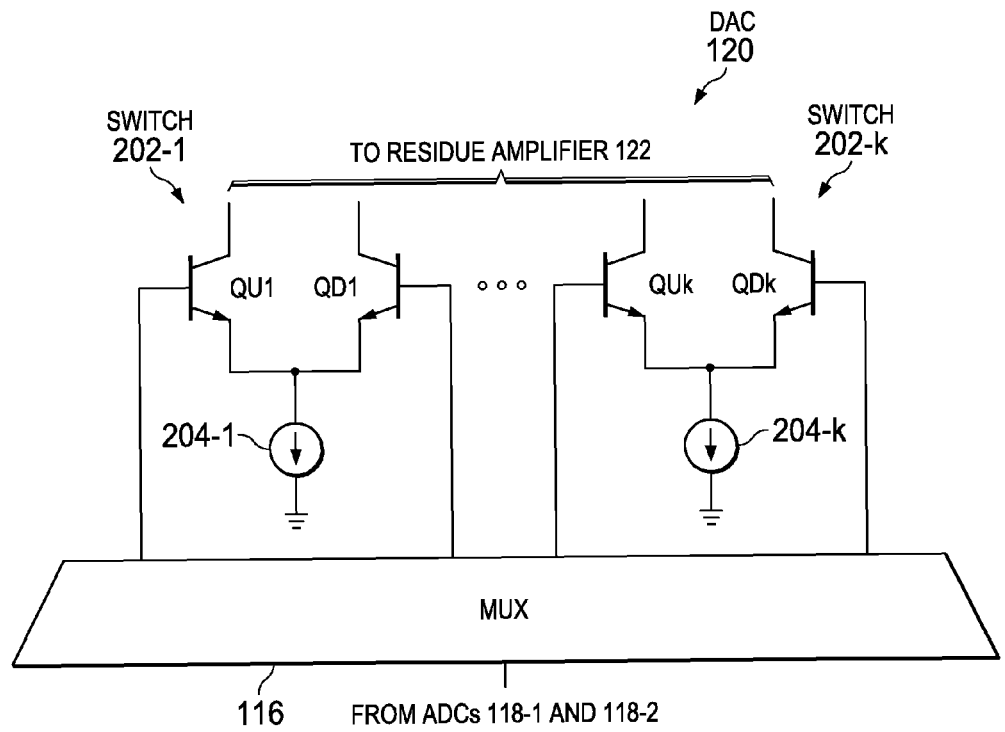
FIG. 2 is a diagram of an example of DAC of FIG. 1.

Refer now to the drawings wherein depicted elements are, for the sake of clarity, not necessarily shown to scale and wherein like or similar elements are designated by the same reference numeral through the several views.

Figure 3:
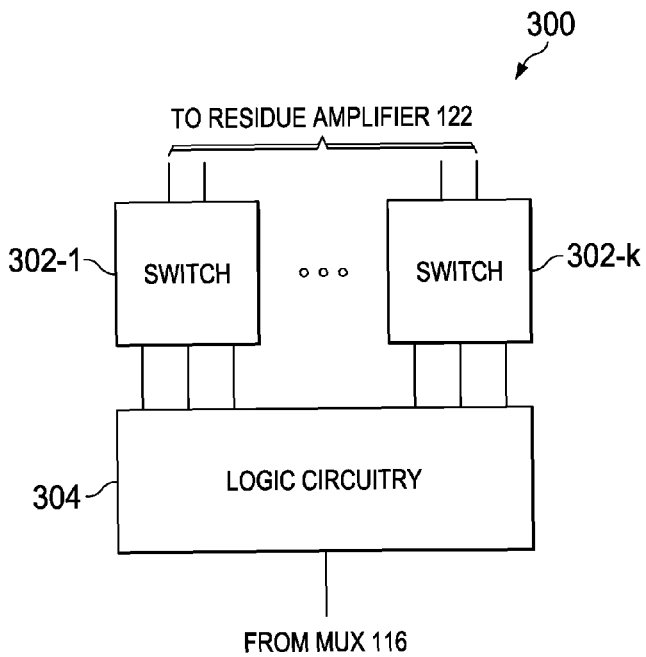
FIG. 3 is a diagram of an example of a DAC in accordance with a preferred embodiment of the present invention.
Figure 4:
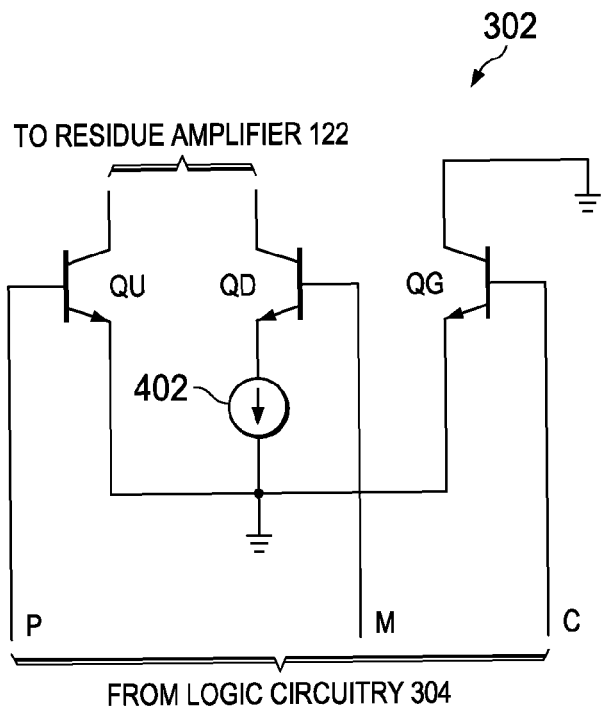
FIG. 4 is a diagram of an example of a three-state DAC switch of FIG. 3.

Turning to FIGS. 3 and 4, an example of a DAC 300 in accordance with a preferred embodiment of the present invention can be seen. As shown, the DAC 300 generally comprises logic circuitry 304 and three-state DAC switches 302-1 to 302-*k*. In operation, the logic circuitry 304 can receive a control word from ADC 118 and can generate control signals (i.e., control signals P, M, and C shown in FIG. 4) for each of the three-state switches 302-1 to 302-*k*. Typically, as shown in FIG. 4, each three-state DAC switch 302-1 to 302-*k* (referred to hereinafter as 302) includes transistors QU QD, QG (which can be NPN transistors) and a current source 402 so that, based on the control signals P, M, and C, the three-state DAC switch 302 can generate a "+1", "−1", or "0" as shown in Table 1 below.

TABLE 1

| P | M | C | State |
|---|---|---|-------|
| 1 | 0 | 0 | +1 |
| 0 | 1 | 0 | −1 |
| 0 | 0 | 1 | 0 |

Figure 5:
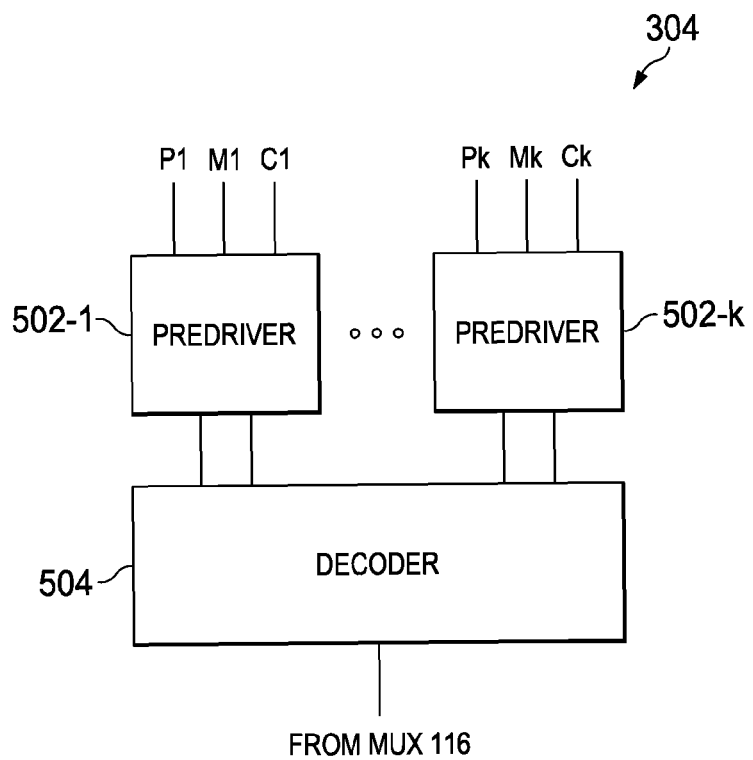
FIG. 5 is a diagram of an example of the logic circuitry of FIG. 3.

To generate the control signals P, M, and C, though, the logic circuitry 304 can employ decoder 504 and predrivers 502-1 to 502-*k* of FIG. 5. The decoder 504 generally receives a control word so as to generate control signals (i.e., two) for predrivers 502-1 to 502-*k*. Each predriver 502-1 to 502-*k* (as shown in this example) outputs three control signals P1/M1/C1 to Pk/Mk/Ck, which generally corresponds to the signal P, M, and C (as shown in FIG. 4).

Figure 6:
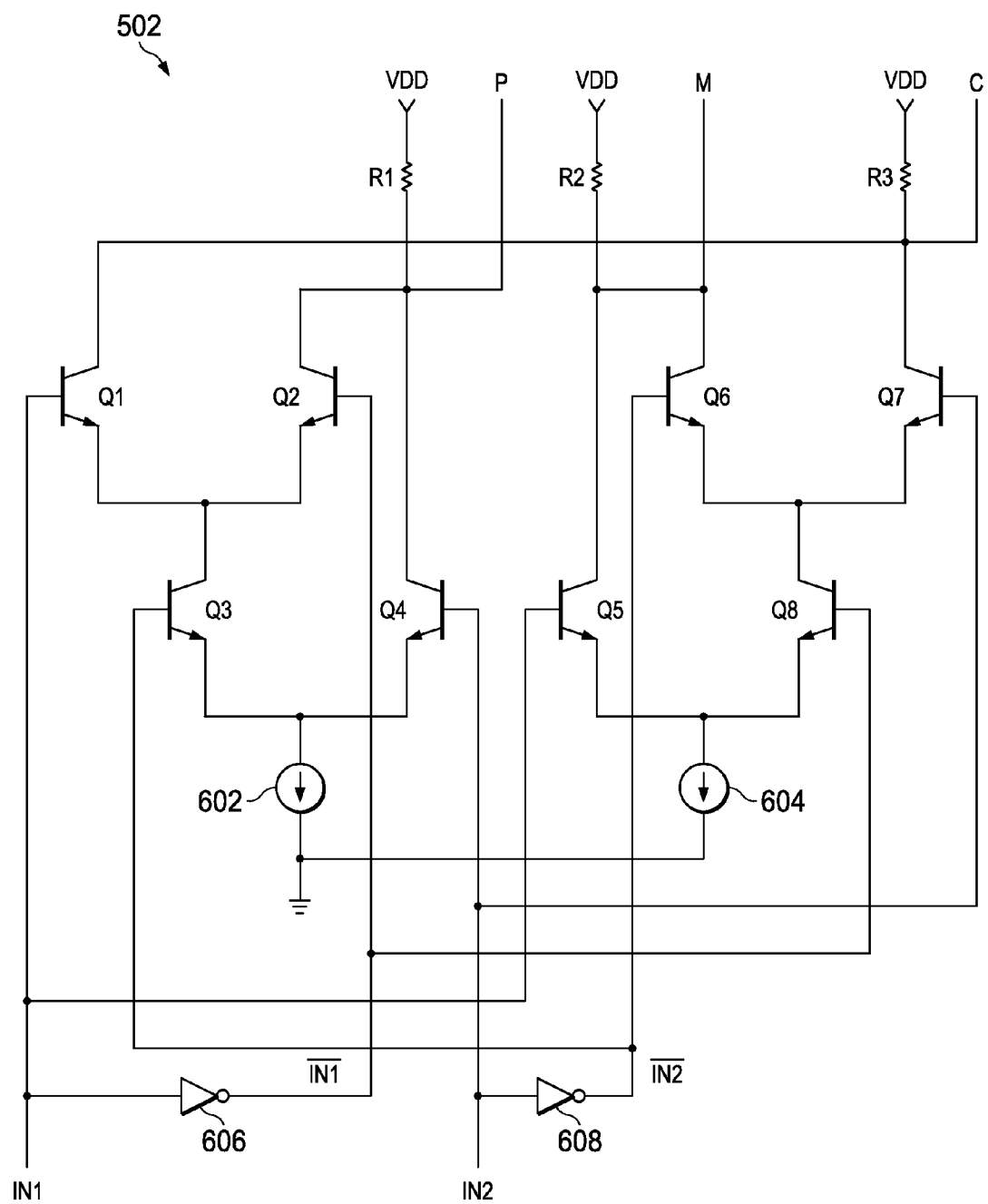
FIG. 6 is a diagram of an example of a predriver of FIG. 5.

Turning now to FIG. 6, an example of predrivers 502-1 to 502-*k* (referred to hereinafter as 502) can be seen in greater detail. As shown, predriver 502 generally comprises sets of cascaded differential pairs of transistors Q1 through Q4 and Q5 through Q8 (which can be NPN transistors), current sources 602-1 and 602-2, and resistors R1 through R3. In operation, control signals IN1 and IN2 can be provided by decoder 504 with inverted control signals $\overline{IN1}$ and $\overline{IN2}$ being generated by inverters 606 and 608; alternatively, inverted control signals $\overline{IN1}$ and $\overline{IN2}$ can be provided by decoder 504. Typically, control signal IN1 and inverted control signal $\overline{IN1}$ are provided to differential pairs Q1/Q2 and Q5/Q8, while control signal IN2 and inverted control signal $\overline{IN2}$ are provided to differential pairs Q3/Q4 and Q6/Q7. Based on the state of control signals IN1 and IN2 (and the associated inverter control signals $\overline{IN1}$ and $\overline{IN2}$), the predriver 502 can generate the control signals P, M, and C shown in Table 1 above. As an illustration, the derivation of control signals P, M, and C from control signals IN1 and IN2 for predriver 502 can be seen in Table 2 below.

TABLE 2

| IN1 | IN2 | P | M | C |
|---|---|---|---|---|
| 0 | 0 | 0 | 0 | 1 |
| 0 | 1 | 1 | 0 | 0 |
| 1 | 0 | 0 | 1 | 0 |
| 1 | 1 | X | X | X |

A reason for using this DAC 300 is that transistor QG (for each switch 302-1 to 303-$k$) enables a reduction in noise contribution from current source 402 (for each switch 302-1 to 303-$k$) for a significant portion of the transfer response. For example, with DAC 120, there would be a noise contribution from each current source 204-1 to 204-R for a 0V output, but, with DAC 300, there would be no noise contribution from current source 402 (from any of switches 302-1 to 203-$k$) for a 0V output. Additionally, because of this feature, to achieve $2^n$ DAC levels, $2^{n-1}$ three-state DAC switches (i.e., 302-1) could be used in DAC 300 instead of $2^n$ DAC switches (i.e., 202-1) in DAC 120, which results in a reduction in area.

To further illustrate some of the benefits of DAC 300 over DAC 120, Tables 3 and 4 are provided below. For the examples shown in Tables 3 and 4, each of DAC 120 and 300 has a total of 15 states (ranging from −7 to 7). As can clearly be seen, there are 14 DAC switches (labeled 202-1 to 202-14) used for DAC 120, whereas there are 7 three-state DAC switches (labeled 302-1 to 302-7) used for DAC. Additionally, for DAC 120 (as shown in Table 3) there are noise contributions from each of the 14 current sources (one for each DAC switch 202-1 to 202-14) for all of the 15 states, whereas, for DAC 300, the noise contribution rages from zero current sources (for the "0" state) to seven (for the "−7" and "+7" states).

TABLE 3

| DAC State | −7 | −6 | −5 | −4 | −3 | −2 | −1 | 0 | 1 | 2 | 3 | 4 | 5 | 6 | 7 |
|---|---|---|---|---|---|---|---|---|---|---|---|---|---|---|---|
| DAC switch 202-1 | −1 | −1 | −1 | −1 | −1 | −1 | −1 | −1 | −1 | −1 | −1 | −1 | −1 | −1 | 1 |
| DAC switch 202-2 | −1 | −1 | −1 | −1 | −1 | −1 | −1 | −1 | −1 | −1 | −1 | −1 | −1 | 1 | 1 |
| DAC switch 202-3 | −1 | −1 | −1 | −1 | −1 | −1 | −1 | −1 | −1 | −1 | −1 | −1 | 1 | 1 | 1 |
| DAC switch 202-4 | −1 | −1 | −1 | −1 | −1 | −1 | −1 | −1 | −1 | −1 | −1 | 1 | 1 | 1 | 1 |
| DAC switch 202-5 | −1 | −1 | −1 | −1 | −1 | −1 | −1 | −1 | −1 | −1 | 1 | 1 | 1 | 1 | 1 |
| DAC switch 202-6 | −1 | −1 | −1 | −1 | −1 | −1 | −1 | −1 | −1 | 1 | 1 | 1 | 1 | 1 | 1 |
| DAC switch 202-7 | −1 | −1 | −1 | −1 | −1 | −1 | −1 | −1 | 1 | 1 | 1 | 1 | 1 | 1 | 1 |
| DAC switch 202-8 | −1 | −1 | −1 | −1 | −1 | −1 | −1 | 1 | 1 | 1 | 1 | 1 | 1 | 1 | 1 |
| DAC switch 202-9 | −1 | −1 | −1 | −1 | −1 | −1 | 1 | 1 | 1 | 1 | 1 | 1 | 1 | 1 | 1 |
| DAC switch 202-10 | −1 | −1 | −1 | −1 | −1 | 1 | 1 | 1 | 1 | 1 | 1 | 1 | 1 | 1 | 1 |
| DAC switch 202-11 | −1 | −1 | −1 | −1 | 1 | 1 | 1 | 1 | 1 | 1 | 1 | 1 | 1 | 1 | 1 |
| DAC switch 202-12 | −1 | −1 | −1 | 1 | 1 | 1 | 1 | 1 | 1 | 1 | 1 | 1 | 1 | 1 | 1 |
| DAC switch 202-13 | −1 | −1 | 1 | 1 | 1 | 1 | 1 | 1 | 1 | 1 | 1 | 1 | 1 | 1 | 1 |
| DAC switch 202-14 | −1 | 1 | 1 | 1 | 1 | 1 | 1 | 1 | 1 | 1 | 1 | 1 | 1 | 1 | 1 |
| Noise Contribution | 14 | 14 | 14 | 14 | 14 | 14 | 14 | 14 | 14 | 14 | 14 | 14 | 14 | 14 | 14 |

TABLE 4

| DAC State | | −7 | −6 | −5 | −4 | −3 | −2 | −1 | 0 | 1 | 2 | 3 | 4 | 5 | 6 | 7 |
|---|---|---|---|---|---|---|---|---|---|---|---|---|---|---|---|---|
| Predriver 502-1 | P1 | 1 | 1 | 0 | 0 | 0 | 0 | 0 | 0 | 0 | 0 | 0 | 0 | 0 | 0 | 0 |
| | C1 | 0 | 0 | 1 | 1 | 1 | 1 | 1 | 1 | 1 | 1 | 1 | 1 | 1 | 0 | 0 |
| | M1 | 0 | 0 | 0 | 0 | 0 | 0 | 0 | 0 | 0 | 0 | 0 | 0 | 0 | 1 | 1 |
| DAC switch 302-1 | | −1 | −1 | 0 | 0 | 0 | 0 | 0 | 0 | 0 | 0 | 0 | 0 | 0 | 1 | 1 |
| Predriver 502-2 | P2 | 1 | 1 | 1 | 1 | 0 | 0 | 0 | 0 | 0 | 0 | 0 | 0 | 0 | 0 | 0 |
| | C2 | 0 | 0 | 0 | 0 | 1 | 1 | 1 | 1 | 1 | 1 | 1 | 0 | 0 | 0 | 0 |
| | M2 | 0 | 0 | 0 | 0 | 0 | 0 | 0 | 0 | 0 | 0 | 0 | 1 | 1 | 1 | 1 |

TABLE 4-continued

| DAC State | -7 | -6 | -5 | -4 | -3 | -2 | -1 | 0 | 1 | 2 | 3 | 4 | 5 | 6 | 7 |
|---|---|---|---|---|---|---|---|---|---|---|---|---|---|---|---|
| DAC switch 302-2 | -1 | -1 | -1 | -1 | 0 | 0 | 0 | 0 | 0 | 0 | 0 | 1 | 1 | 1 | 1 |
| Predriver P3 | 1 | 1 | 1 | 1 | 1 | 1 | 0 | 0 | 0 | 0 | 0 | 0 | 0 | 0 | 0 |
| 502-3 C3 | 0 | 0 | 0 | 0 | 0 | 0 | 1 | 1 | 1 | 0 | 0 | 0 | 0 | 0 | 0 |
| M3 | 0 | 0 | 0 | 0 | 0 | 0 | 0 | 0 | 0 | 1 | 1 | 1 | 1 | 1 | 1 |
| DAC switch 302-3 | -1 | -1 | -1 | -1 | -1 | -1 | 0 | 0 | 0 | 1 | 1 | 1 | 1 | 1 | 1 |
| Predriver P4 | 1 | 1 | 1 | 1 | 1 | 1 | 1 | 0 | 0 | 0 | 0 | 0 | 0 | 0 | 0 |
| 502-4 C4 | 0 | 0 | 0 | 0 | 0 | 0 | 0 | 1 | 0 | 0 | 0 | 0 | 0 | 0 | 0 |
| M4 | 0 | 0 | 0 | 0 | 0 | 0 | 0 | 0 | 1 | 1 | 1 | 1 | 1 | 1 | 1 |
| DAC switch 302-4 | -1 | -1 | -1 | -1 | -1 | -1 | -1 | 0 | 1 | 1 | 1 | 1 | 1 | 1 | 1 |
| Predriver P5 | 1 | 1 | 1 | 1 | 1 | 0 | 0 | 0 | 0 | 0 | 0 | 0 | 0 | 0 | 0 |
| 502-5 C5 | 0 | 0 | 0 | 0 | 0 | 1 | 1 | 1 | 1 | 1 | 0 | 0 | 0 | 0 | 0 |
| M5 | 0 | 0 | 0 | 0 | 0 | 0 | 0 | 0 | 0 | 0 | 1 | 1 | 1 | 1 | 1 |
| DAC switch 302-5 | -1 | -1 | -1 | -1 | -1 | 0 | 0 | 0 | 0 | 0 | 1 | 1 | 1 | 1 | 1 |
| Predriver P6 | 1 | 1 | 1 | 0 | 0 | 0 | 0 | 0 | 0 | 0 | 0 | 0 | 0 | 0 | 0 |
| 502-6 C6 | 0 | 0 | 0 | 1 | 1 | 1 | 1 | 1 | 1 | 1 | 1 | 1 | 0 | 0 | 0 |
| M6 | 0 | 0 | 0 | 0 | 0 | 0 | 0 | 0 | 0 | 0 | 0 | 0 | 1 | 1 | 1 |
| DAC switch 302-6 | -1 | -1 | -1 | 0 | 0 | 0 | 0 | 0 | 0 | 0 | 0 | 0 | 1 | 1 | 1 |
| Predriver P7 | 1 | 0 | 0 | 0 | 0 | 0 | 0 | 0 | 0 | 0 | 0 | 0 | 0 | 0 | 0 |
| 502-7 C7 | 0 | 1 | 1 | 1 | 1 | 1 | 1 | 1 | 1 | 1 | 1 | 1 | 1 | 1 | 0 |
| M7 | 0 | 0 | 0 | 0 | 0 | 0 | 0 | 0 | 0 | 0 | 0 | 0 | 0 | 0 | 1 |
| DAC switch 302-7 | -1 | 0 | 0 | 0 | 0 | 0 | 0 | 0 | 0 | 0 | 0 | 0 | 0 | 0 | 1 |
| Noise Contribution | 7 | 6 | 5 | 4 | 3 | 2 | 1 | 0 | 1 | 2 | 3 | 4 | 5 | 6 | 7 |

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a logic circuit that includes:
        a decoder that receives a control word and that generates a plurality of control signals from the control word; and
        a plurality of predrivers that are each coupled to the decoder so as to receive at least one of the control signals; and
    a plurality of three-state digital-to-analog converter (DAC) switches, wherein each three-state DAC is coupled to at least one of the predrivers, wherein each of the plurality of three-state DAC switches includes:
        a current source;
        a first transistor that is coupled to the current source and an associated predriver, wherein the associated predriver controls the first transistor;
        a second transistor that is coupled to the current source and the associated predriver, wherein the associated predriver controls the second transistor; and
        a third transistor that is coupled between the current source and ground and that is coupled to the associated predriver, wherein the associated predriver controls the third transistor.

2. The apparatus of claim 1, wherein the first second and third transistors are NPN transistors, and wherein each of the first, second, and third transistors is coupled to the current source at emitter and to the associated predriver at its base.

3. An apparatus comprising:
    a logic circuit that includes:
        a decoder that receives a control word and that generates a plurality of control signals from the control word; and
        a plurality of predrivers that are each coupled to the decoder so as to receive at least one of the control signals, wherein each predriver includes:
            a first current source;
            a second current source;
            a first cascaded set of differential pairs of transistors that is coupled to first current source and to the decoder; and
            a second cascaded set of differential pairs of transistors that is coupled to first current source and to the decoder; and
    a plurality of three-state DAC switches, wherein each three-state DAC is coupled to at least one of the predrivers.

4. The apparatus of claim 3, wherein the first cascaded set further comprises:
    a first bipolar transistor that is coupled to the decoder at its base and to an associated three-state DAC switch at its collector;
    a second bipolar transistor that is coupled to the decoder at its base and to the associated three-state DAC switch at its collector;
    a third bipolar transistor that is coupled to the decoder at its base, to the emitters of the first and second bipolar transistors at its collector, and to the first current source at its emitter; and
    a fourth bipolar transistor that is coupled to the decoder at its base, to the associated three-state DAC switch at its collector, and to the first current source at its emitter.

5. The apparatus of claim 4, wherein the second cascaded set further comprises:
    a fifth bipolar transistor that is coupled to the decoder at its base and to the associated three-state DAC switch at its collector;
    a sixth bipolar transistor that is coupled to the decoder at its base and to the associated three-state DAC switch at its collector;
    a seventh bipolar transistor that is coupled to the decoder at its base, to the emitters of the fifth and sixth bipolar transistors at its collector, and to the second current source at its emitter; and
    an eighth bipolar transistor that is coupled to the decoder at its base, to the associated three-state DAC switch at its collector, and to the second current source at its emitter.

6. An apparatus comprising:
a digital output circuit; and
a pipeline having a plurality of analog-to-digital converter (ADC) stages that are coupled in together in a sequence, wherein each ADC stage includes:
 a track-and-hold (T/H) circuit;
 a sub-ADC that is coupled to the T/H circuit and to the digital output circuit;
 a DAC that is coupled to the sub-ADC, wherein the DAC includes:
  a decoder that is coupled to the sub-ADC;
  a plurality of predrivers that are each coupled to the decoder; and
  a plurality of three-state DAC switches, wherein each three-state DAC is coupled to at least one of the predrivers, wherein each of the plurality of three-state DAC switches includes:
   a current source;
   a first transistor that is coupled to the current source and an associated predriver, wherein the associated predriver controls the first transistor;
   a second transistor that is coupled to the current source and the associated predriver, wherein the associated predriver controls the second transistor; and
   a third transistor that is coupled between the current source and ground and that is coupled to the associated predriver, wherein the associated predriver controls the third transistor; and
 a residue amplifier that is coupled to the DAC and the T/H circuit.

7. The apparatus of claim 6, wherein the first second and third transistors are NPN transistors, and wherein each of the first, second, and third transistors is coupled to the current source at emitter and to the associated predriver at its base.

8. An apparatus comprising:
a digital output circuit; and
a pipeline having a plurality of analog-to-digital converter (ADC) stages that are coupled in together in a sequence, wherein each ADC stage includes:
 a track-and-hold (T/H) circuit;
 a sub-ADC that is coupled to the T/H circuit and to the digital output circuit;
 a DAC that is coupled to the sub-ADC, wherein the DAC includes:
  a decoder that is coupled to the sub-ADC;
  a plurality of predrivers that are each coupled to the decoder, wherein each predriver includes:
   a first current source;
   a second current source;
   a first cascaded set of differential pairs of transistors that is coupled to first current source and to the decoder; and
   a second cascaded set of differential pairs of transistors that is coupled to first current source and to the decoder;
  a plurality of three-state DAC switches, wherein each three-state DAC is coupled to at least one of the predrivers; and
 a residue amplifier that is coupled to the DAC and the T/H circuit.

9. The apparatus of claim 8, wherein the first cascaded set further comprises:
 a first bipolar transistor that is coupled to the decoder at its base and to an associated three-state DAC switch at its collector;
 a second bipolar transistor that is coupled to the decoder at its base and to the associated three-state DAC switch at its collector;
 a third bipolar transistor that is coupled to the decoder at its base, to the emitters of the first and second bipolar transistors at its collector, and to the first current source at its emitter; and
 a fourth bipolar transistor that is coupled to the decoder at its base, to the associated three-state DAC switch at its collector, and to the first current source at its emitter.

10. The apparatus of claim 9, wherein the second cascaded set further comprises:
 a fifth bipolar transistor that is coupled to the decoder at its base and to the associated three-state DAC switch at its collector;
 a sixth bipolar transistor that is coupled to the decoder at its base and to the associated three-state DAC switch at its collector;
 a seventh bipolar transistor that is coupled to the decoder at its base, to the emitters of the fifth and sixth bipolar transistors at its collector, and to the second current source at its emitter; and
 an eighth bipolar transistor that is coupled to the decoder at its base, to the associated three-state DAC switch at its collector, and to the second current source at its emitter.

11. The apparatus of claim 10, wherein the pipeline further comprises:
 a buffer that receives an analog input signal and that is coupled to the first ADC stage of the sequence; and
 a plurality of output ADCs that are each coupled to the last ADC stage of the sequence and to the digital output circuit.

12. An apparatus comprising:
a digital output circuit that generates a digital output signal;
a buffer that receives an analog input signal;
a plurality of ADC stages that are coupled in together in a sequence, the first ADC stage of the sequence is coupled to the buffer, and wherein each ADC stage includes:
 a T/H circuit;
 a sub-ADC that is coupled to the T/H circuit and to the digital output circuit;
 a DAC that is coupled to the sub-ADC, wherein the DAC includes:
  a decoder that is coupled to the sub-ADC;
  a plurality of predrivers, wherein each predriver includes:
   a first current source;
   a second current source;
   a first cascaded set of differential pairs of transistors that is coupled to first current source and to the decoder;
   a second cascaded set of differential pairs of transistors that is coupled to first current source and to the decoder; and
  a plurality of three-state DAC switches, wherein each three-state DAC includes:
   a current source;
   a first transistor that is coupled to the current source and an associated predriver, wherein the associated predriver controls the first transistor;
   a second transistor that is coupled to the current source and the associated predriver, wherein the associated predriver controls the second transistor; and
   a third transistor that is coupled between the current source and ground and that is coupled to the associated predriver, wherein the associated predriver controls the third transistor; and a residue amplifier that is coupled to the first and second transistors from each three-state DAC switch and the T/H circuit; and an output ADC that is coupled to the last ADC stage of the sequence and the digital output circuit.

13. The apparatus of claim 12, wherein the first second and third transistors are bipolar transistors, and wherein each of the first, second, and third transistors is coupled to the current source at emitter and to the associated predriver at its base.

14. The apparatus of claim 12, wherein the first cascaded set further comprises:

a first bipolar transistor that is coupled to the decoder at its base and to an associated three-state DAC switch at its collector;

a second bipolar transistor that is coupled to the decoder at its base and to the associated three-state DAC switch at its collector;

a third bipolar transistor that is coupled to the decoder at its base, to the emitters of the first and second bipolar transistors at its collector, and to the first current source at its emitter; and a fourth bipolar transistor that is coupled to the decoder at its base, to the associated three-state DAC switch at its collector, and to the first current source at its emitter.

15. The apparatus of claim 14, wherein the second cascaded set further comprises:

a fifth bipolar transistor that is coupled to the decoder at its base and to the associated three-state DAC switch at its collector;

a sixth bipolar transistor that is coupled to the decoder at its base and to the associated three-state DAC switch at its collector;

a seventh bipolar transistor that is coupled to the decoder at its base, to the emitters of the fifth and sixth bipolar transistors at its collector, and to the second current source at its emitter; and an eighth bipolar transistor that is coupled to the decoder at its base, to the associated three-state DAC switch at its collector, and to the second current source at its emitter.

\* \* \* \* \*